United States Patent [19]
Bluzer et al.

[11] 4,321,614
[45] Mar. 23, 1982

[54] RADIANT ENERGY SENSOR WITH BLOOMING CONTROL

[75] Inventors: Nathan Bluzer, Silver Spring; Donald R. Lampe, Ellicott City; Francis J. Kub, Pasadena, all of Md.

[73] Assignee: Westinghouse Electric Corp., Pittsburgh, Pa.

[21] Appl. No.: 129,530

[22] Filed: Mar. 12, 1980

[51] Int. Cl.³ .................... H01L 27/14; H01L 29/78
[52] U.S. Cl. ........................... 357/30; 357/24; 357/23; 357/41
[58] Field of Search .................. 357/24, 23, 41, 30

[56] References Cited

U.S. PATENT DOCUMENTS

| | | | |
|---|---|---|---|
| 4,028,716 | 6/1977 | van Santen | 357/24 |
| 4,028,719 | 6/1977 | Curtis | 357/30 |
| 4,093,872 | 6/1978 | Hartman | 357/24 X |
| 4,142,198 | 2/1979 | Finnila | 357/24 |
| 4,176,369 | 11/1979 | Nelson | 357/30 X |
| 4,190,851 | 2/1980 | Finnila | 357/30 |
| 4,198,646 | 4/1980 | Alexander | 357/30 |
| 4,257,057 | 3/1981 | Cheung | 357/30 X |

*Primary Examiner*—Martin H. Edlow
*Attorney, Agent, or Firm*—R. M. Trepp

[57] ABSTRACT

A radiant energy sensor incorporating a substrate having two electrodes on a first surface and a third electrode on a second surface is described wherein a first electrode collects a first portion of charge generated by radiant energy absorbed in the substrate to provide an output signal and wherein the second electrode is biased with a voltage supply to attract and remove a second portion of charge from the substrate and first electrode to prevent blooming due to excess charge. The sensor includes a layer of semiconductor material deposited over the substrate and over the first and second electrode to conserve detector area and to permit the location of circuitry over top of the second electrode.

21 Claims, 12 Drawing Figures

RADIANT ENERGY SENSOR WITH BLOOMING CONTROL

CROSS-REFERENCE TO RELATED APPLICATION

This application is cross-referenced to an application entitled "Radiant Energy Sensor with Blooming Control" by M. M. Sopira and D. K. Schroder, having Ser. No. 104,946 filed on Dec. 18, 1979, which is a continuation of Ser. No. 916,611 filed June 19, 1978, now abandoned, which was conceived after the conception date of the invention herein and which describes a radiant energy sensor employing an electrode positioned on a substrate surface and next to one electrode of a detector to provide blooming control to remove excess charge generated by intense radiant energy in the detector.

BACKGROUND OF THE INVENTION

This invention relates to radiant energy sensors, and more particularly, to a radiant energy sensor employing an electrode to provide blooming control to remove excess charge generated by intense radiant energy which otherwise would spill into adjacent detectors and employing another electrode insulated on a semiconductor layer above a floating electrode for transferring charge collected by the floating electrode through a depletion region of the semiconductor layer.

DESCRIPTION OF THE PRIOR ART

In the prior art, blooming or overload control due to excess charge was implemented by surface channel techniques. For example, excess charge in a charge coupled device (CCD) transfer channel due to an intense light spot would be allowed to spill over a potential barrier into a drain. The potential barrier and drain would therefore remove excess charge and prevent it from spreading along the entire CCD channel containing other charge packets from other detectors.

Extrinsic silicon infrared detector arrays are being developed because they promise better performance than can be obtained with present IR arrays. In particular, the number and density of detectors in extrinsic silicon monolithic focal plane arrays (MFPA) will be appreciably higher than can be done with other detectors today. In addition, monolithic local plane arrays have both detectors and signal processing circuitry incorporated on the array. The full implementation of silicon monolithic focal plane arrays requires clever chip layout in order to incorporate the detection, charge injection and signal processing function into a unit cell which may be combined with other unit cells to form an array. The unit cell representative of a single detector or pixel element may be as small as 40 microns×45 microns in high performance forward looking infrared systems.

In visible imaging devices, such as CCD's, blooming control to contain charge generated by intense light spots may be implemented at the surface by providing diode/gate control which drains any charge exceeding a predetermined saturation level. However, in extrinsic silicon monolithic focal plane array's both injection and readout gating must be provided in the unit cell or pixel element. For very small pixel elements, there may not be sufficient area to implement surface blooming control structures used in the prior art.

It is therefore desirable to provide a blooming control structure which utilizes a minimum of surface area.

It is further desirable to provide a blooming control structure which may be located beneath the surface of the unit cell to permit the location of circuitry on the surface.

SUMMARY OF THE INVENTION

In accordance with the present invention, a sensor is provided for converting radiant energy into electrical signals comprising a substrate having a first and second surface and including means for generating electronic charge in response to the absorption of radiant energy, a layer of semiconductor material having a first dopant deposited over the second surface of the substrate to form a third surface above the second surface, a first and second electrode formed in the second surface, a third electrode formed in the first surface, means for coupling a first voltage across the first and third electrodes to attract electronic charge to the first electrode, means for coupling a bias voltage supply across the second and third electrodes to attract electronic charge to the second electrode to remove electronic charge from the substrate and first electrode and means for providing a signal indicative of the electronic charge on the first electrode.

The invention further provides a sensor for converting radiant energy into electrical charge comprising a substrate having a first and second surface and including means for generating electronic charge in response to the absorption of radiant energy, a layer of semiconductor material having a first dopant deposited over the second surface of the substrate to form a third surface above the second surface, a first electrode formed in the second surface, a second electrode insulated from and positioned on the third surface over the first electrode, a third electrode formed in the first surface and having portions underneath the first electrode, means for applying a first voltage across the second and third electrodes to attract electronic charge to the first electrode, and means for applying a second voltage across the second and third electrodes to provide a depletion region in the semiconductor material extending from the second electrode to the first electrode to conduct charge from the first electrode to the third surface and semiconductor region below the second electrode.

The invention further provides a sensor for converting radiant energy into electrical charge comprising a substrate including a plurality of detectors, each comprising one of the above embodiments.

DESCRIPTION OF THE PREFERRED EMBODIMENTS

Figure 1:
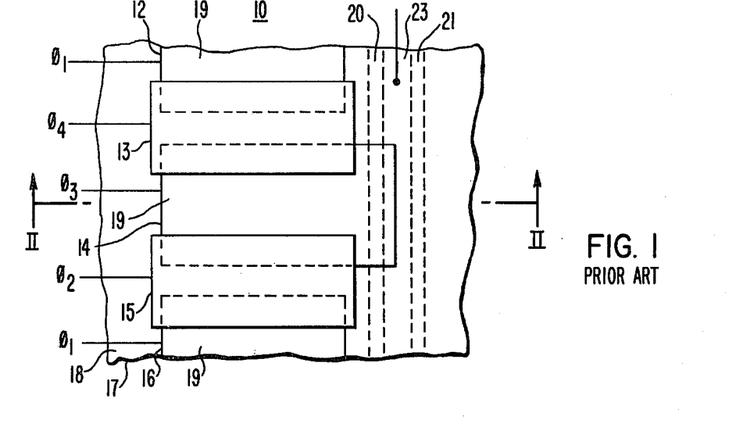
FIG. 1 is a plan view of a prior art charge coupled device (CCD) with blooming or overload control.
Figure 2:
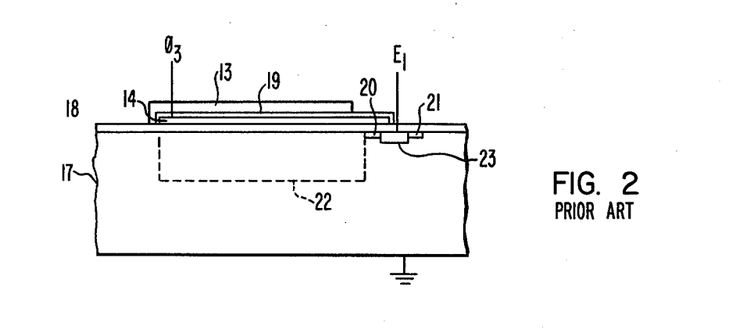
FIG. 2 is a cross-section view along the lines II—II of FIG. 1.

Referring to FIG. 1, a plan view of a prior art charge coupled device 10 is shown having electrodes 12 through 16 deposited on substrate 17. Electrodes 12 through 16 are insulated from substrate 17 by insulation layer 18. Electrodes 12 through 16 are also insulated from each other such as by silicon oxide formed on the upper surface of electrodes 12, 14 and 16, and designated insulation layer 19. Electrodes 12 through 16 are coupled to appropriate clock signals such as $\phi_1$ through $\phi_4$ for successively transferring charge in substrate 17 under the control of electrodes 12 through 16. Substrate 17, for example, may be N-type. A N-type dopant may be introduced into substrate 17 at regions 20 and 21 by ion implantation to provide a potential barrier to the charge in channel 22 of CCD 10 shown in FIG. 2. A P-diffusion 23 is located between regions 20 and 21 and provides a drain or conductor path for removing charge. P-diffusion 23 is biased by voltage supply $E_1$. FIG. 2 is a cross-section view along the lines II—II of FIG. 1.

Figure 3:
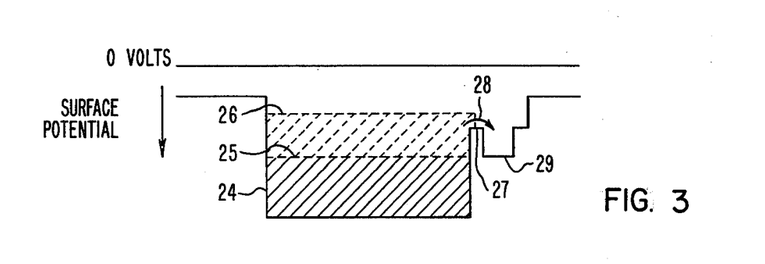
FIG. 3 is a graph showing the surface potential along the lines II—II of FIG. 1.

FIG. 3 is a graph showing the surface potential along the lines II—II of FIG. 1. In FIG. 3 the ordinate represents surface potential in volts. Below electrode 14 a potential well 24 is formed by the voltage of clock $\phi_3$ which holds charge underneath electrode 14. Normal amounts of charge may fill potential well 24 up to potential line 25. Excess charge in potential well 24 may fill potential well 24 up to potential line 26. Region 20 has a potential barrier indicated by potential line 27 which will pass charge from potential well 24 into the drain or P-diffusion 23 if the charge in potential well 24 exceeds potential barrier 27. In FIG. 3 charge having a potential in excess of potential barrier 27 will pass over potential barrier 27 as shown by arrow 28 to the drain or P-diffusion 23 which has a lower potential than potential barrier 27 due to the biasing or voltage of voltage supply $E_1$. The region below P-diffusion 23 may have a potential line 29 due to the voltage $E_1$. Charge which is attracted to P-diffusion 23 is removed by voltage supply $E_1$. Thus, P-diffusion 23 and ion implanted region 20 provide a means for removing excess charge from channel 22 of potential well 24 of CCD 10. Alternate structures for providing a potential barrier 27 may be provided by a gate electrode over region 20 which is biased appropriately or by thick oxide in region 20. The use of a gate or thick oxide to provide a potential barrier 27 is old in the art.

Figure 4:
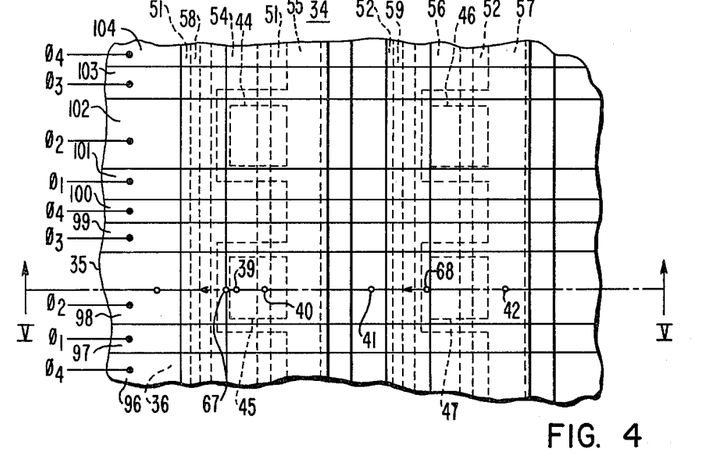
FIG. 4 is a plan view of one embodiment of the invention.
Figure 5:
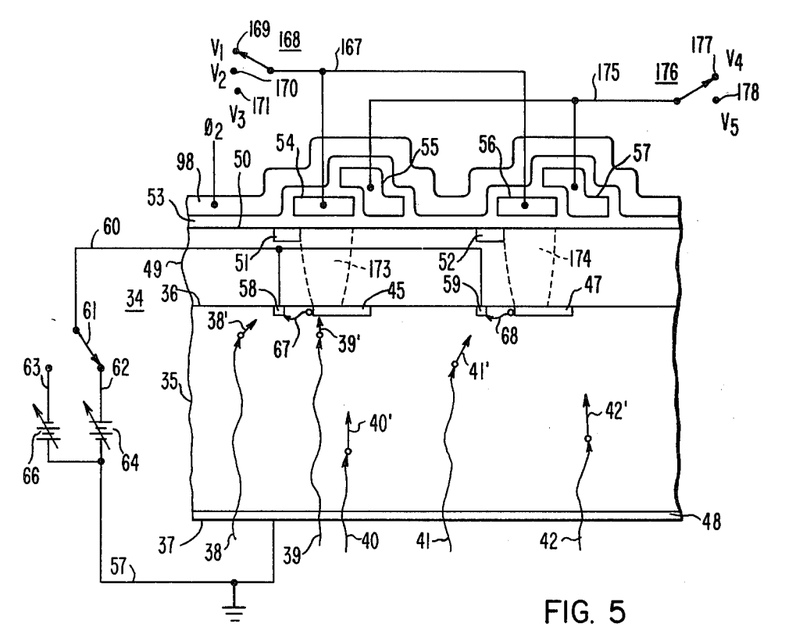
FIG. 5 is a cross-section view along the lines V—V of FIG. 4 with the appropriate circuitry shown in schematic form.

FIG. 4 is a plan view of one embodiment of the invention. In FIG. 4, sensor 34 functions to convert radiant energy into electrical signals. FIG. 5 is a cross-section view along the lines V—V of FIG. 4 with appropriate circuitry shown in schematic form. Sensor 34 includes substrate 35 having a first surface 36 and a second surface 37. Substrate 35 includes means for passing radiant energy into substrate 35 such as, for example, through second surface 37. Alternately, radiant energy may pass into substrate 35 through another entry point such as the first surface 36. Substrate 35 includes means for generating electronic charge 38' through 42' in response to the absorption of radiant energy 38 through 42. Substrate 35, for example, may be silicon doped with indium to form an extrinsic silicon infrared sensor. Substrate 35 may be cooled in the range from 60° to 20° kelvin to improve performance. Electrodes 44 through 47 may be, for example, P-diffusions in, below or beneath first surface 36 for collecting electronic charge 38' through 42' generated in substrate 35 in the form of holes by the absorption of radiant energy 38 through 42. Electrode 48 is on or inside second surface 37 shown in FIG. 5 and extends to the area beneath electrodes 44 through 47. Electrodes 44 through 47 may be electrically floating without ohmic contact to an output circuit.

Above first surface 36 is a semiconductor layer 49 having an upper surface 50. Semiconductor layer 49 has doped regions 51 and 52 formed in the upper surface 50. Regions 51 and 52 function to provide a channel stop for charge in semiconductor layer 49.

Semiconductor layer 49 may be for example N-type epitaxial silicon. Regions 51 and 52 may be for example an N+ type region. Overlaying semiconductor layer 49 is insulation layer 53 which may be for example silicon dioxide.

Signal storage gate 54 is insulated by insulation layer 53 from and positioned on upper surface 50 over electrodes 44 and 45. Signal storage gate 56 is insulated by insulation layer 53 from and positioned on upper surface 50 over electrodes 46 and 47.

Electrode 48 formed on second surface 37 has portions extending underneath or opposite electrodes 44 through 47 and signal storage gates 54 and 56.

Signal storage gates 54 and 56 are coupled together over line 167 to one side of switch 168. The other side of switch 168 has three terminals 169, 170 and 171 which are coupled to voltages $V_1$, $V_2$, and $V_3$ respectively. Line 167 may be coupled by means of switch 168 to one of the three terminals 169, 170 and 171. Switch 168 provides a means for applying a first voltage $V_1$ across electrodes 54 and 48 to attract electronic charge to electrodes 44 and 45.

Likewise, switch 168 provides a means for applying a first voltage $V_1$ across electrodes 56 and 48 to attract electronic charge to electrodes 46 and 47. While electrodes 44 through 47 may be floating electrically they will be capacitively coupled to either electrode 54 or 56. The potential on electrodes 44 through 47 will be sufficient to attract charge, holes, generated in the region between itself and electrode 48 and serve as a collection point or region for charge generated in the detector regions between each of electrodes 44 through 47 and electrode 48.

Switch 168 provides a means for applying a second voltage, $V_2$, across electrodes 54 and 56 and electrode 48 to provide a depletion region 173 underneath electrode 54 and depletion region 174 underneath electrode 56. Both depletion regions 173 and 174 are formed in semiconductor material or layer 49 extending from electrode 54 to electrodes 44 and 45 and from electrode 56 to electrodes 46 and 47. Both depletion regions 173 and 174 conduct charge from electrodes 44 through 47 to the upper surface 50 and semiconductor region below electrodes 54 and 56 that are above electrodes 44 through 47. These depletion regions below electrodes 54 and 56 may actually be potential wells of a charge coupled device (CCD).

Transfer gates 55 and 57 are coupled together over line 175 to one side of switch 176. The other side of switch 176 has two terminals 177 and 178 which are coupled to voltages $V_4$ and $V_5$ respectively. Line 175 may be coupled by means of switch 176 to one of two terminals 177 or 178. Switch 176 provides a means for applying a voltage $V_4$ across transfer gates 55 and 57 to transfer charge underneath electrodes 54 and 56 into respective positions of a charge coupled device such as a multi-bit shift register 179 for shifting the charge out of the sensor. The shift register 179 may be a four phase shift register comprised of electrodes 96 through 104 as shown in FIG. 4. Electrodes 96 through 104 are fabricated and function in similar manner to like referenced electrodes in FIGS. 6 and 9. Signals $\phi_1$ through $\phi_4$ provide signals to the electrodes to shift the charges in each bit position such as under electrodes 98 and 102 initially along the shift register 179 to an output terminal.

Switch 176 may couple voltage $V_5$ to transfer gates 55 and 57 at times when no transfer of charge is desired and the charge is held below signal storage gates 54 and 56. Switch 168 may couple voltage $V_3$ to signal storage gates 54 and 56 at times to provide a potential to facilitate the transfer of charge from under gates 54 and 56 through transfer gates 55 and 57.

Insulation 53 functions to isolate electrodes 96 through 104 from each other and from gates 54 through 57.

Electrodes 58 and 59 are formed in, at, below or beneath first surface 36 and may be, for example, P+ diffusions. Electrodes 58 and 59 are coupled over line 60 to one side of switch 61 which functions to couple line 60 to either line 62 or line 63. Switch 61, for example, may be a single-pole, double-throw switch. Line 62 is coupled to one side of battery 64 with the other side coupled to line 57. Line 63 is coupled to one side of battery 66 with the other side coupled to line 57. Batteries 64 and 66 may have their voltage adjusted and arranged opposite polarity in the circuit to provide either a positive or negative voltage on line 60 depending upon the position of switch 61. Electrodes 58 and 59 are coupled to the bias voltage, battery 64 or 66 to attract and remove a portion of electronic charge generated in substrate 35 and from electrodes 45 and 47, respectively.

When excess charge is generated in substrate 35, due to intense radiant energy from a target, electrode 45, for example, will rise in potential. Excess charge, such as electronic charge 67, from electrode 45 due to its raised potential wil spill or flow through substrate 35 to electrode 58. Likewise electronic charge 68 would flow to electrode 59. When substrate 35 is composed of extrinsic silicon and operated at low temperatures such as 20° Kelvin, substrate 35 becomes an insulator. Potential wells at low temperature do not have sharp corners because substrate 35 acts as an insulator, tending to spread out potential wells. For this reason, barrier implants or gates are not required to provide a potential barrier between electrode 45 and electrode 48. Rather, the blooming drain or electrode 58 reduces the barrier between itself and the collection diffusion or electrode 45, by virtue of a lateral field component or voltage difference between electrode 58 and 45. The amount of barrier reduction is controlled by the voltage applied to the drain line or electrode 58. The result is that electrode 58 acts as a blooming line or drain to excess charge in substrate 35 or on electrode 45 before this charge may pass to the output circuit, shift register 179 or spill over to other detectors.

Figure 7:
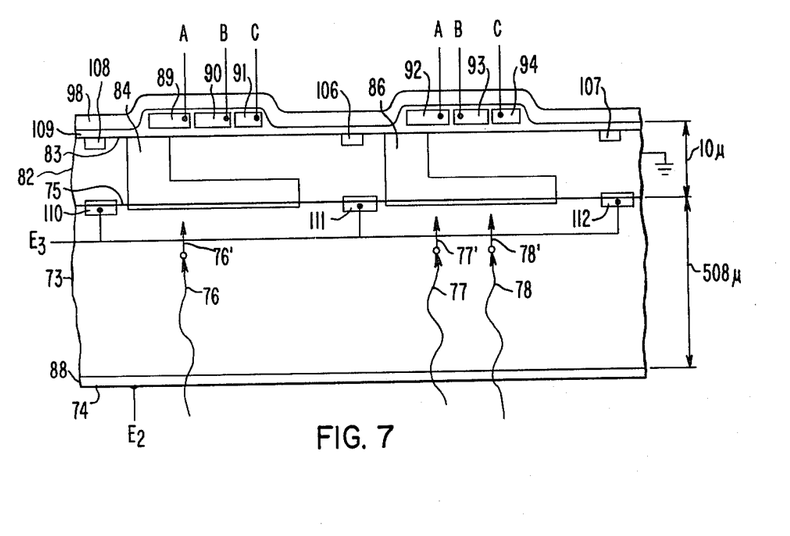
FIG. 7 is a cross-section view along the lines VII—VII of FIG. 6.

The photogenerated current or charge in substrate 35 underneath electrode 45 will be collected by electrode 45 under signal storage gate 54 shown in FIG. 5. A sufficient voltage applied to gate 54 will cause the resultant depletion region to punch through semiconductor layer 49 (which may be n doped epitaxial silicon, for example) to electrode 45, which may be a P+ diffusion region. Following integration of one dwell time for sensing radiant energy, the collected photogenerated charge may be transferred from under the signal storage gate 54 into the CCD shift register 179 located at the right of the N+ diffusion 51 by transfer gate 55. The use of a punch through effect to make contact to electrode 45 achieves a higher density structure than a vertical P+ conduction channel diffusion through semiconductor layer 49 such as shown in FIG. 7 or an etched V-groove contact. The potential drop required across a 5 micron N-type semiconductor layer 49 for depletion punch-through is about 10 volts.

The speed of the vertical charge injection into the CCD well below signal storage gate 54 is very fast. With a drift field greater than 10 KV/cm, charge will transport from electrode 45 to the CCD well or region below signal storage gate 54 in less than 1 nanosecond. The noise associated with vertical injection of photocurrent into the region below signal storage gate 54 will be shot noise. The spectral noise power amplitude of the noise produced from the vertical injection could be comparable to the noise associated with direct current injection into a CCD diffused diode, for example.

The lateral area that electrode 44 collects charge may define the area for a detector on the upper surface 36. The detector volume may be the area projected down to the bottom electrode 48 from which electrode 44 may collect charge. Electrodes 44 through 47 along with electrodes 58 and 59 may therefore comprise four unit cells or four detectors extending from first surface 36 to second surface 37.

Figure 6:
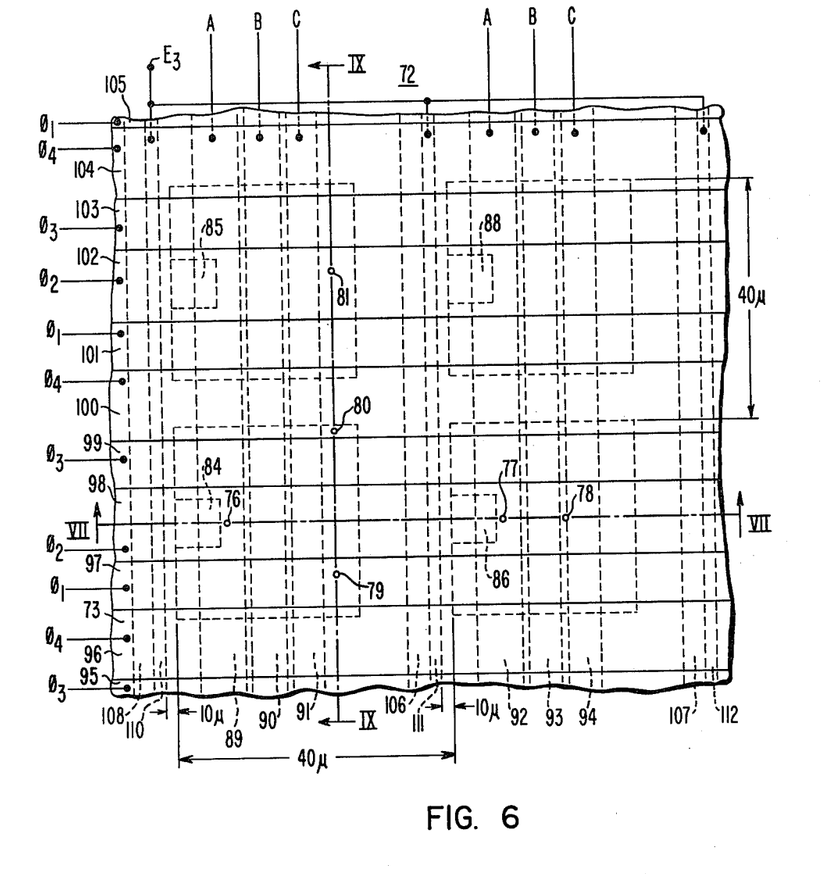
FIG. 6 is a plan view of an alternate embodiment of the invention.
Figure 9:
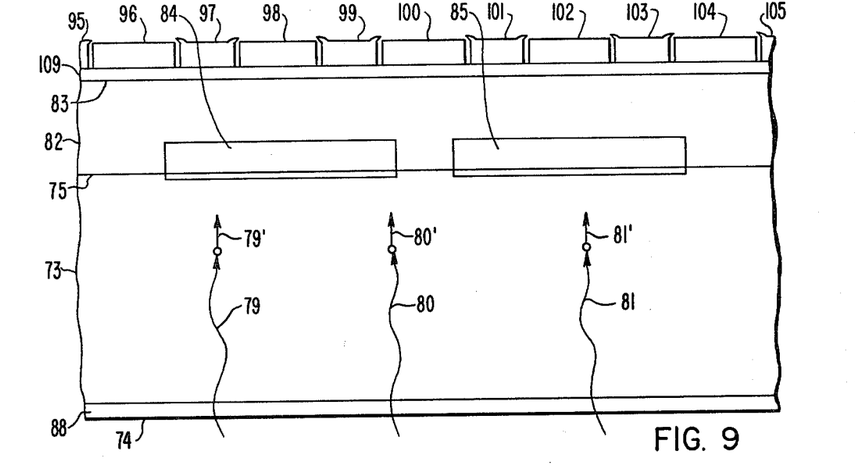
FIG. 9 is a cross-section view along the lines IX—IX of FIG. 6.

FIG. 6 is a plan view of sensor 72. FIGS. 7 and 9 are cross section views along the lines VII—VII and IX—IX of FIG. 6, respectively. Sensor 72 includes substrate 73 having a first surface 74 and a second surface 75. Substrate 73 includes means for generating electronic charge 76' through 81' in response to the absorption of radiant energy 76 through 81. Substrate 73 may be for example silicon doped with indium, 508 microns thick, to form an extrinsic silicon infrared detector. When radiant energy 76 through 81 is absorbed in substrate 73, holes 76' through 81' are generated providing electronic charge in substrate 73. A layer 82 of semiconductor material having a first dopant is deposited over second surface 75 of substrate 73 to form a third surface 83 above second surface 75. Semiconductor layer 82 may be, for example, N-type epitaxial silicon 10 microns thick. Substrate 73, if composed of silicon doped with indium, will exhibit a P-type characteristic. Electrodes 84 through 87 may be, for example, formed in, below or beneath second surface 75 and extend into semiconductor layer 82 with a portion of the electrode extending up to third surface 83. Electrodes 84 through 87 may, for example, be P+ diffusions positioned in a one or two dimensional array on 40 micron centers and function to collect electronic charge generated in substrate 73. Electrode 88 is formed on or inside first surface 74 of substrate 73 and may, for example, be a P+ diffusion. Radiant energy 76 through 81 may enter substrate 73 through first surface 74. Electrode 88 may be lightly doped to appear transparent to radiant energy 76 through 81. In the arrangement shown in FIGS. 6, 7 and 9, electronic charge is collected by electrodes 84 through 87 and injected by means of respective injection gates 89, 90 and 91 for electrodes 84 and 85 and injection gates 92 through 94 for electrodes 86 and 87 into a charge coupled device for transfer of the charge out of sensor 72 or to perform time delay integration where the charge is moved in conjunction with the movement of an image across sensor 72 to permit integration. CCD electrodes 95 through 105 may be coupled to a four phase clock having phases $\phi_1$ through $\phi_4$, as shown in FIG. 6 for transferring charge in a channel in semiconductor layer 82 located between injection gate 91 and N+ diffusion 106 and between injection gate 94 and N+ diffusion 107. N+ diffusions 106 and 107 act as channel stoppers to contain the charge in the CCD device, which is well known in the art. N+ diffusion 108 also acts as a channel stopper. CCD electrodes 95 through 105 overlap each other to provide continuous control by means of potential wells in the channel in semiconductor layer 82. CCD electrodes 95 through 105 and injection gates 89 through 94 are insulated from one another by insulation medium 109. Semiconductor layer 82 may, for example, be coupled to ground, while electrode 88 may be coupled to voltage supply $E_2$, which may supply a voltage in the range from +20 to +50 volts. Injection gates 89 through 94 which are coupled to control signals A, B and C provide a means for coupling a first voltage across electrodes 84 through 87 and electrode 88 to attract electronic charge respectively from each electrode 84 through 87. Injection gates 89 through 91 and 92 through 94 provide a means for transferring a signal indicative of the electronic charge collected by each electrode 84 through 87 respectively. Electrodes 110 and 111 are formed in, at, above or beneath second surface 75 of substrate 73 and are located a predetermined distance, for example 10 microns, from electrodes 84 through 87. Electrodes 110 and 11 may, for example, be a P+ diffusion. Electrodes 110 and 111 are coupled to a bias voltage supply, $E_3$, with its ground return coupled to elecrode 82 as shown in FIG. 7. The bias voltage $E_3$ is adjusted to attract electronic charge to electrodes 110 and 111 to remove electronic charge primarily from electrodes 84 through 87 and to a lesser extent from substrate 73.

Figure 8:
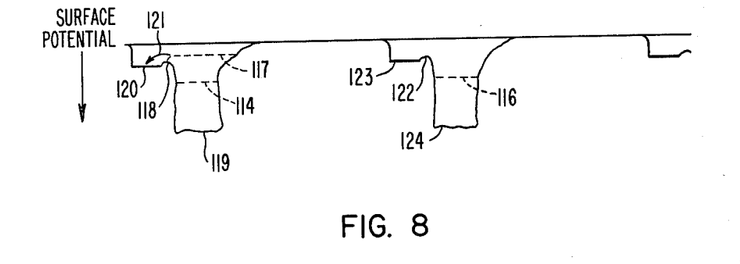
FIG. 8 is a graph showing the surface potential along the lines VII—VII of FIG. 6.

FIG. 8 is a graph showing the surface potential along the lines VII—VII of FIG 6. In FIG. 8, the ordinate represents surface potential in volts and the abscissa represents distance along the lines VII—VII of FIG. 6. In FIG. 8, injection gates 89 through 94 are off or about 0 volts and electrodes 110 through 112 are biased by voltage $E_3$. When electrodes 84 and 86 collect charge from substrate 73, the collected charge raises the surface potential in the normal case below electrode 84 to potential line 114 and below electrode 86 to potential line 116. If excess charge is collected by electrode 84, the charge will raise the potential to, for example, potential line 117. If potential line 117 exceeds the potential barrier 118 between electrodes 84 and 110, potential 119 of electrode 84 and potential 120 of electrode 110, then charge represented by arrow 121 will flow over potential barrier 118 into diffusion 110. Charge flowing into P+ diffusion 110 will be removed by bias voltage supply $E_3$, thereby providing blooming control for sensor 72. The embodiment in FIG. 7 allows injection gates and charge coupled devices located on the surface of sensor 72, while allowing the blooming control diffusions 110 and 111 and potential barriers 118 and 122 between the diffusions 110 and 111 and electrodes 84 through 87 to be buried below the surface 83 of semiconductor layer 82.

Figure 10:
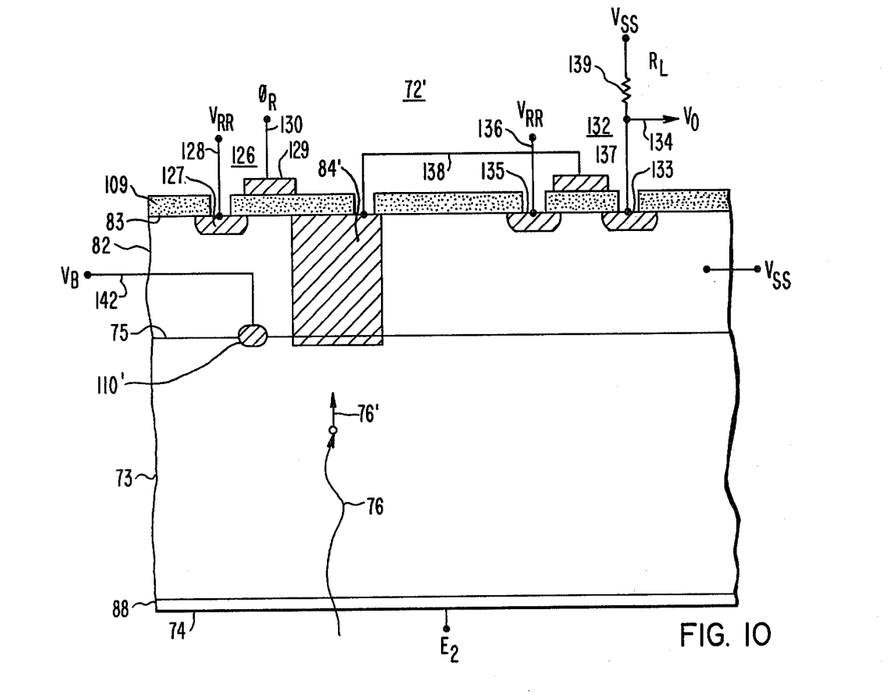
FIG. 10 is a cross-section view of an embodiment of the invention with appropriate circuitry for testing.

FIG. 10 is a cross section view of an embodiment of the invention, sensor 72', which was used for testing. In FIG. 10, like references are used for elements corresponding to those in FIG. 6. Electrode 84' is similar to electrode 84 and may be a P+ diffusion, with a different geometric shape. Electrode 110' also may have a slightly different geometric shape such as an oval instead of rectangular cross-section. An MOS transistor 126 is formed having a source formed by P+ diffusion 84', a drain formed by P+ diffusion 127 which is coupled to line 128, and gate electrode 129 which is coupled to line 130. Transistor 132 is formed having a source electrode formed by P+ diffusion 133 coupled to line 134. A drain electrode formed by P+ diffusion 135 is coupled to line 136. The gate electrode 137 is coupled over line 138 to P+ diffusion 84'. Line 134 is coupled to one side of resistor 139, with the other side coupled to voltage supply, $V_{SS}$. P+ diffusion 110' is coupled over line 142 to a bias voltage supply, $V_B$. Transistors 126 and 132 are conventional in the art, having a channel with a typical length to width ratio. Transistor 126 is used to set the detector voltage or the voltage of P+ diffusion 84' to a reference level $V_{RR}$ when transistor 126 is turned on by the signal $\phi_R$ on line 130. Transistor 126 is turned on periodically, which is chosen for a desired readout rate and the radiation level or intensity in substrate 73. During the interval between turning transistor 126 on, the detector current from P+ diffusion 84' is integrated by the capacitance at the gate electrode 137 of transistor 132. The resulting voltage on the gate of transistor 132 changes the conductance of transistor 132, giving an output signal $V_O$ on line 134.

Figure 11:
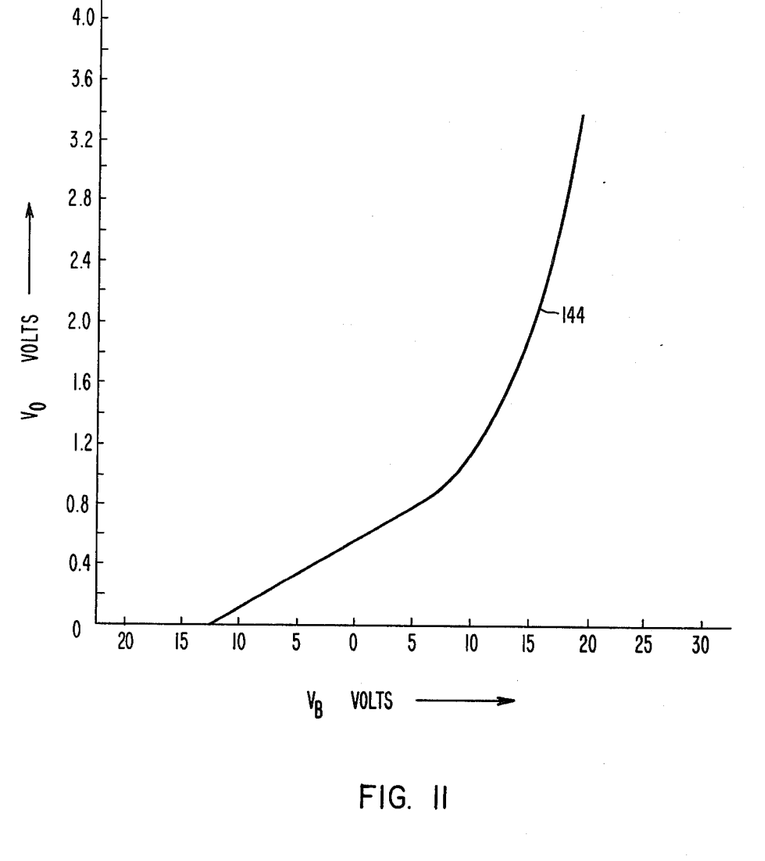
FIG. 11 is a curve showing output voltage, $V_O$, as a function of bias voltage on the blooming control electrode of FIG. 10.

FIG. 11 is a curve showing the output voltage, $V_O$, as a function of the bias voltage, $V_B$, on the blooming control electrode 110' of FIG. 10. In FIG. 11, the ordinate represents volts and the abscissa represents volts. Measurements were made with the following parameters:

Infrared Radiation = Ambient (300° kelvin);
$E_2 = +25$ volts;
N-EPI layer 82 = +20 volts;
$V_{RR} = 0$ volts;
$V_{SS} = +20$ volts;
$F_{\phi R} = 20$ kilohertz; and
T = 20° kelvin.

Curve 144 in FIG. 11 shows that the output level, $V_O$, decreases as more charge or current is drawn away from substrate 73 and electrode 84' as the bias voltage $V_B$ of P+ diffusion 110' is made more negative.

Figure 12:
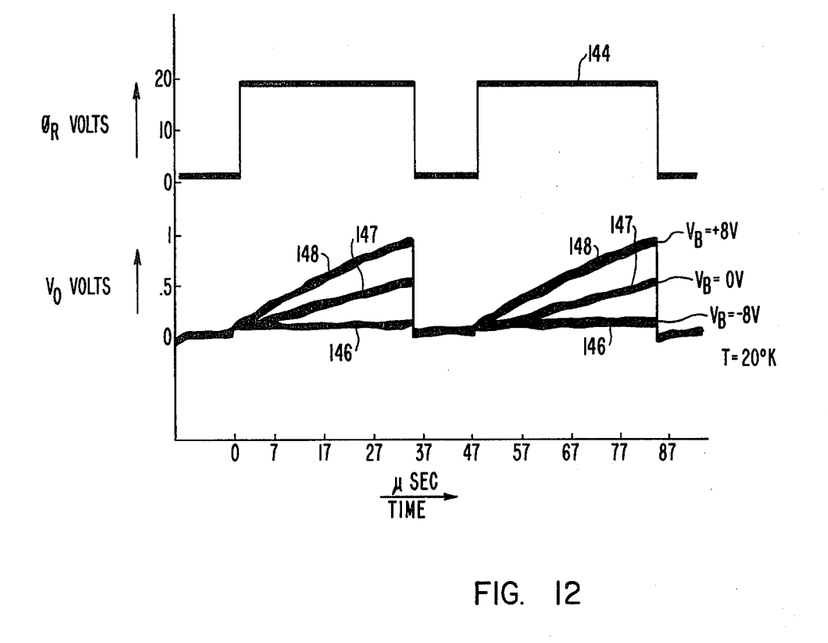
FIG. 12 is a set of curves showing typical wave forms of the output voltage, $V_O$, as a function of time and of bias voltage on the blooming control electrode of FIG. 10.

The effect of P+ diffusion 110' is clearly shown by curves 146 through 148 where curve 146 is for a $V_B$ of −8 volts; curve 147 for a $V_B$ of 0 volts, and curve 148 for a $V_B$ of +8 volts. As can be seen in FIG. 12, curve 148 with a bias voltage of +8 volts is least attractive for the photo-generated holes in substrate 73 and at electrode 84', the output signal $V_O$ is high. As the P+ diffusion 110' is made progressively more negative, more of the photocharge in substrate 73 and on P+ diffusion 84' is drained or removed and the output signal $V_O$ decreases, thus showing the effectiveness of the buried electrode 110'.

We claim:

1. A sensor for convering radiant energy into electrical signals comprising:
   a substrate having a first and second surface and including means for generating charge in response to the absorption of radiant energy,
   a layer of semiconductor material having a first dopant deposited over said second surface of said substrate to form a third surface above said second surface,
   a first and second electrode formed in said second surface,
   a third electrode formed in said first surface,
   means for coupling a first voltage across said first and third electrodes to attract charge to said first electrode,
   means for coupling a bias voltage supply across said second and third electrodes to attract charge to said second electrode to remove charge from said substrate and said first electrode, and
   means for providing a signal indicative of the charge on said first electrode.

2. The sensor of claim 1 wherein said first and second electrodes are spaced apart in the range 5 to 25 microns.

3. The sensor of claim 1 further including means for cooling said substrate to a temperature below 60° kelvin.

4. The sensor of claim 1 wherein said means for coupling a first voltage includes a CCD transfer gate for coupling charge out of said first electrode.

5. The sensor of claim 4 wherein said CCD transfer gate is located on said third surface.

6. The sensor of claim 1 wherein said first and second electrode are above and below said second surface and positioned apart in the range from 5 to 25 microns.

7. A sensor for converting radiant energy into electrical signals comprising:
   a substrate having a first surface suitable for receiving radiant energy and a second surface,
   a layer of semiconductor material having a first dopant deposited over said second surface of said crystalline substrate to form a third surface above said second surface,
   a first region in said layer to semiconductor material having a second dopant, said region extending from said second to third surfaces for collecting charge generated in said substrate in response to the passing of radiant energy,
   a second region having a second dopant below said third surface and located a predetermined distance from said first region,
   means for coupling a bias voltage to said second region for attracting excess charge collected by said first region.

8. The sensor of claim 7 wherein said substrate is photosensitive to radiant energy passed into it.

9. The sensor of claim 7 wherein said first dopant is N type.

10. The sensor of claim 7 wherein said second dopant is P type.

11. The sensor of claim 7 wherein said predetermined distance is in the range from 5 to 25 microns.

12. The sensor of claim 7 further including means for cooling said substrate below 60° kelvin.

13. The sensor of claim 1 wherein said means for generating charge includes second dopants.

14. A sensor for converting radiant energy into electrical signals comprising:
   a substrate having a first and second surface and including means for generating charge in response to the absorption of radiant energy,
   a layer of semiconductor material having a first dopant deposited over said second surface of said substrate to form a third surface above said second surface, said substrate including a plurality of detectors each comprising a first and second electrode formed in said second surface and a third electrode formed in said first surface,
   means for coupling a first voltage across said first and third electrodes of each detector to attract charge to said first electrode,
   means for coupling a bias voltage supply across said second and third electrodes of each detector to attract charge to said second electrode of each detector to remove charge from said substrate and said first electrode of each detector, and
   means for providing a signal indicative of the charge on said first electrode of each detector.

15. A sensor for converting radiant energy into electrical signals comprising:
   a substrate having a first surface suitable for receiving radiant energy and a second surface,
   a layer of semiconductor material having a first dopant deposited over said second surface of said crystalline substrate to form a third surface above said second surface, said substrate including a plurality of detectors each comprising a first region in said layer of semiconductor material having a second dopant, said region extending from said second to third surfaces for collecting charge generated in said substrate in response to the passing of radiant energy, and a second region having a second dopant below said third surface and located a predetermined distance from said first region,
   means for coupling a bias voltage to said second region of each detector for attracting excess charge collected by said first region.

16. A sensor for converting radiant energy into electrical charge comprising:
   a substrate having a first and second surface and including means for generating charge in response to the absorption of radiant energy,
   a layer of semiconductor material having a first dopant deposited over said second surface of said substrate to form a thid surface above said second surface,
   a first electrode formed in said second surface,
   a second electrode insulated from and positioned on said third surface over said first electrode,
   a third electrode formed in said first surface, and having portions underneath said first electrode,
   means for applying a first voltage across said second and third electrodes to attract charge to said first electrode, and
   means for applying a second voltage across said second and third electrodes to provide a depletion region in said semiconductor material extending from said second electrode to said first electrode to conduct charge from said first elecrode to said third surface semiconductor region below said second electrode.

17. The sensor of claim 16 wherein said means for generating charge includes second dopants.

18. A sensor for converting radiant energy into electrical charge comprising:
- a substrate having a first and second surface and including means for generating charge in response to the absorption of radiant energy,
- a layer of semiconductor material having a first dopant deposited over said second surface of said substrate to form a third surface above said second surface, said substrate including a plurality of detectors each comprising a first electrode formed in said second surface,
- a second electrode insulated from and positioned on said third surface over said first electrode, and a third electrode formed in said first surface, and having portions underneath said first electrode,
- means for applying a first voltage across said second and third electrodes of each detector to attract charge to said first electrode, and
- means for applying a second voltage across said second and third electrodes of each detector to provide a depletion region in said semiconductor material extending from said second electrode to said first electrode of each detector to conduct charge from said first electrode to said third surface and semiconductor region below said second electrode of each detector.

19. The sensor of claim 16 or 18 wherein said first electrode is floating.

20. The sensor of claim 16 further including a charge coupled device shift register positioned in said semiconductor layer, and
- means for transferring said charge from said third surface and region below said second electrode into said charge coupled device shift register.

21. The sensor of claim 18 further including
- a charge coupled device shift register having a plurality of storage positions positioned on said substrate,
- means for transferring said charge from said third surface and region below said second electrode of each detector into said charge coupled device shift register.

* * * * *